United States Patent [19]

Corboy, Jr. et al.

[11] Patent Number: 4,698,316
[45] Date of Patent: Oct. 6, 1987

[54] METHOD OF DEPOSITING UNIFORMLY THICK SELECTIVE EPITAXIAL SILICON

[75] Inventors: John F. Corboy, Jr., East Amwell Township, Hunterdon County; Robert H. Pagliaro, Jr., Ewing Township, Mercer County; Lubomir L. Jastrzebski, Plainsboro; Ramazan Soydan, Berkley Township, Ocean County, all of N.J.

[73] Assignee: RCA Corporation, Princeton, N.J.
[21] Appl. No.: 802,994
[22] Filed: Nov. 29, 1985

Related U.S. Application Data

[63] Continuation-in-part of Ser. No. 694,100, Jan. 23, 1985, Pat. No. 4,592,792.

[51] Int. Cl.⁴ .................... H01L 21/205; H01L 21/76
[52] U.S. Cl. ..................................... 437/89; 156/612; 156/613; 156/647; 156/657; 156/662; 437/64; 437/228
[58] Field of Search ....... 148/175, DIG. 25, DIG. 26, 148/DIG. 50; 29/576 E, 578; 156/612, 613, 647, 657, 662

[56] References Cited

U.S. PATENT DOCUMENTS

| | | | |
|---|---|---|---|
| 3,239,372 | 3/1966 | Sirtl | 117/201 |
| 3,511,702 | 5/1970 | Jackson, Jr. et al. | 117/212 |
| 3,661,636 | 5/1972 | Green, II et al. | 117/201 |
| 3,746,908 | 7/1973 | Engeler | 315/10 |
| 3,945,864 | 3/1976 | Goldsmith et al. | 148/175 |
| 4,400,411 | 8/1983 | Yuan et al. | 427/86 |
| 4,497,683 | 2/1985 | Celler et al. | 156/603 |
| 4,522,662 | 6/1985 | Bradbury et al. | 148/175 |
| 4,547,231 | 10/1985 | Hine | 148/175 |
| 4,549,926 | 10/1985 | Corboy, Jr. et al. | 156/612 |
| 4,578,142 | 3/1986 | Corboy et al. | 156/612 |
| 4,592,792 | 6/1986 | Corboy et al. | 148/175 |

OTHER PUBLICATIONS

Advances in Dichlorosilane Epitaxial Technology, D. J. DeLong, *Solid State Technology*, Oct. 1972, pp. 29–34, 41.
Selective Epitaxial Deposition of Silicon, B. D. Joyce et al., *Nature*, vol. 195, pp. 485–486, Aug. 4, 1962.
The "Epicon" Array: A New Semiconductor Array-Type Camera Tube Structure, W. E. Engeler et al., *Applied Physics Letters*, vol. 16, No. 5, Mar. 1, 1970.
The Epicon Camera Tube: An Epitaxial Diode Array Vidicon, S. M. Blumenfeld et al., *IEEE Trans.*, vol. ED18, No. 11, Nov. 1971.
Effect of Substrate Preparation and Growth Ambient on Silicon Selective Epitaxy, H. M. Liaw et al., *Proceedings of the Electrochemical Society*, CVD IX, Cincinnati, Ohio, 1984, pp. 463–475.
Selective Epitaxy Using Silane and Germane, D. J. Dumin, *Vapour Growth and Epitaxy, J. Crystal Growth*, vol. 31, (1975), pp. 33–36.
Selective Silicon Epitaxy Using Reduced Pressure Technique, K. Tanno et al., *Japanese Journal of Applied Physics*, vol. 21, No. 9, Sep. 1982, pp. L564–L566.
The Growth and Etching of Si Through Windows in SiO₂, W. G. Oldham et al., *J. Electrochem. Soc.: Solid State Science*, vol. 114, No. 4, Apr. 1967, pp. 381–388.
Selective Etching and Epitaxial Refilling of Silicon Wells in the System SiH₄/HCl/H₂, M. Druminski et al., *Journal of Crystal Growth* 31, (1975), pp. 312–316.
Selective Epitaxy of Silicon Under Quasi-Equilibrium Conditions, E. Sirtl et al., *Semiconductor Silicon*, R. R. Haberrecht and E. L. Klein, Eds., New York: Electrochemical Society, May 1969, pp. 189–199.

*Primary Examiner*—William G. Saba
*Attorney, Agent, or Firm*—Allen L. Limberg; Kenneth R. Glick

[57] ABSTRACT

A method for depositing monocrystalline silicon at a uniform rate onto a plurality of unequally sized monocrystalline nucleation sites comprises initially providing a substrate having an apertured oxide mask on a major surface thereof. The oxide mask includes a plurality of apertures each of which exposes a nucleation site on the substrate surface. The substrate is then exposed to a mixture of dichlorosilane and hydrogen chloride at 850° C. and a pressure less than approximately 50 torr, for a predetermined time. This yields a monocrystalline silicon island extending from each nucleation site. Each of the islands has a substantially flat profile across the major surface thereof and all islands are equal in thickness.

5 Claims, 12 Drawing Figures

METHOD OF DEPOSITING UNIFORMLY THICK SELECTIVE EPITAXIAL SILICON

This is a continuation-in-part of application Ser. No. 694,100, filed on Jan. 23, 1985, and now U.S. Pat. No. 4,592,792 which issued on Jun. 3, 1986.

The present invention relates to a method for forming monocrystalline silicon by selective epitaxy. More particularly, the invention relates to a process for fabricating a plurality of monocrystalline silicon islands at apertures in a mask layer that overlies a monocrystalline substrate.

BACKGROUND OF THE INVENTION

In the field of semiconductor device processing epitaxially deposited silicon is commonly used in a variety of applications. Basically, this deposition, also referred to as growth, involves the precipitation of silicon from a source gas onto a crystal lattice, such that the deposited silicon forms a structure which continues the crystal lattice. Conventionally used silicon-source gases include silane ($SiH_4$), silicon tetrachloride ($SiCl_4$), trichlorosilane ($SiHCl_3$), and dichlorosilane ($SiH_2Cl_2$), the details of typical processing are described in ADVANCES IN DICHLOROSILANE EPITAXIAL TECHNOLOGY, D. J. DeLong, Solid State Technology, Oct. 1972, pp. 29–34, 41, and in U.S. Pat. No. 3,945,864, METHOD OF GROWING THICK EPITAXIAL LAYERS OF SILICON, N. Goldsmith et al., issued Mar. 23, 1976. The quality and rate of silicon deposition is a strong function of such parameters as deposition temperature and specific gas composition, as elaborated upon in U.S. Pat. No. 3,239,372, METHOD OF PRODUCING SINGLE CRYSTALLINE SILICON, E. Sirtl, issued Mar.8, 1966, as well as in the previously cited references.

Epitaxial deposits of silicon have also been selectively grown within the apertures of a silicon dioxide ($SiO_2$) mask on the surface of a monocrystalline silicon substrate. An example of such a process is described in SELECTIVE EPITAXIAL DEPOSITION OF SILICON, B. D. Joyce et al., Nature, Vol. 195, pp. 485, 6, Aug. 4, 1962. Selective epitaxial deposition has also been used to form a grid of monocrystalline silicon islands wherein the grid is specified by a particular center-to-center spacing of an array of apertures in a silicon dioxide layer, and wherein each silicon island overgrows the silicon dioxide surrounding each apertures a specific distance. An example of such an overgrown structure and its manufacturing method is described in THE "EPICON" ARRAY: A NEW SEMICONDUCTOR ARRAY-TYPE CAMERA TUBE STRUCTURE, W. E. Engeler et al., Applied Physics Letters, Vol. 16, No. 5, Mar. 1, 1970; THE EPICON CAMERA TUBE: AN EPITAXIAL DIODE ARRAY VIDICON, S. M. Blumenfeld et al., IEEE Trans., Vol. ED18, No. 11, Nov. 1971; and in U.S. Pat. No. 3,746,908, SOLID STATE LIGHT SENSITIVE STORAGE ARRAY, W. E. Engeler, issued July 17, 1973.

It has been recognized that while monocrystalline silicon will nucleate on a monocrystalline substrate, a monocrystalline layer will not be nucleated on an amorphous surface. That is, when a surface such as that of a silicon dioxide mask layer is subjected to an epitaxial deposition environment, a non-single-crystalline silicon film is typically deposited. The tendency of an epitaxial deposition process to form monocrystalline material on a monocrystalline nucleation site as opposed to non-monocrystalline material on adjacent mask areas is commonly referred to as the selectivity of the process. As disclosed in the literature, a host of interdependent factors influences this selectivity.

When silicon is epitaxially deposited, conventional deposition temperatures are in the range of approximately 900° to 1300° C. although as disclosed in U.S. Pat. No. 3,511,702, EPITAXIAL GROWTH PROCESS FROM AN ATMOSPHERE COMPOSED OF A HYDROGEN HALIDE, SEMICONDUCTOR HALIDE AND HYDROGEN, D. M. Jackson, Jr. et al., May 12, 1970, temperatures as low as 800° C. and as high as 1400° C. may be useable. In an effort to suppress the growth of non-monocrystalline silicon on the mask layer several approaches have been taken. In commonly assigned U.S. Pat. application Ser. No. 608,544, METHOD FOR GROWING MONOCRYSTALLINE SILICON THROUGH A MASK LAYER, J. F. Corboy, Jr. et al. filed May 10, 1984, now U.S. Pat. No. 4,578,142, issued Mar. 25, 1986 a two stage selective epitaxial deposition process is described. Basically, this process comprises providing a substrate having an apertured mask thereon and subjecting the substrate to a two stage deposition cycle. In the first stage silicon is deposited from a silicon-source gas. In the second stage, performed in situ, a portion of the deposited silicon is etched by subjecting the substrate to a silicon etching gas.

In EFFECT OF SUBSTRATE PREPARATION AND GROWTH AMBIENT ON SILICON SELECTIVE EPITAXY, H. M. Liaw et al., Proceedings of the Electrochemical Society, CVD IX, Cincinnati, Ohio 1984, pp. 463–475, it is indicated that using $SiCl_4$ as a silicon-source gas yields better selectivity than using $SiH_2Cl_2$. In SELECTIVE EPITAXY USING SILANE AND GERMANE, D. J. Dumin, Vapour Growth and Epitaxy. J. Crystal Growth, Vol. 31, (1975), pp. 33–36, it is taught that selectivity is enhanced by using $SiH_4$ as a silicon-source gas and growing at temperatures in the range of 1180° to 1270° C., whereas at low growth temperatures silicon is formed on top of the adjacent oxide mask. The interdependence of growth rate, selectivity, $Si/SiO_2$ ratio (nucleation site area/mask area) and presence of HCl with the silicon-source gas during deposition is elaborated upon in SELECTIVE SILICON EPITAXY USING REDUCED PRESSURE TECHNIQUE, K. Tanno et al., Japanese Journal of Applied Physics, Vol. 21, No. 9, September 1982, pp. L564–L566. This reference indicates that by using a $SiH_2Cl_2/HCl/H_2$ deposition system in the 900°–1000° C. range at a pressure less than 80 torr, a suitable HCl concentration for selective epitaxial growth is a function of the exposed $Si/SiO_2$ surface area ratio.

In U.S. Pat. No. 4,497,683, PROCESS FOR PRODUCING DIELECTRICALLY ISOLATED SILICON DEVICES, G. K. Celler et al., Feb. 5, 1985, a selective epitaxial deposition process is described wherein an oxide mask is overgrown with non-monocrystalline silicon and subsequently converted to monocrystalline material by a heat treatment which uses the selectively deposited monocrystalline silicon as a nucleation seed. Further elaboration on the relationship between the $Si/SiO_2$ area ratio and growth rate may be found in THE GROWTH AND ETCHING OF Si THROUGH WINDOWS IN $SiO_2$, W. G. Oldham et al., *J. Electrochem. Soc.: Solid State Science*, Vol. 114, No. 4, April 1967, pp. 381-388.

In SELECTIVE ETCHING AND EPITAXIAL REFILLING OF SILICON WELLS IN THE SYSTEM SiH$_4$/HCl/H$_2$, M. Druminski et al., *Journal of Crystal Growth* 31, (1975), pp. 312-316, wells are etched in a silicon surface and are subsequently refilled by selective epitaxy using an SiCl$_4$/H$_2$ system at about 1200° C. or an SiH$_4$/HCl/H$_2$ system at about 1150° C. This reference indicates that the flatness of the epitaxial deposit may be controlled by varying the HCl concentration during the deposition. In commonly assigned U.S. patent application Ser. No. 694,100, METHOD FOR FORMING UNIFORMLY THICK SELECTIVE EPITAXIAL SILICON, J. F. Corboy, Jr. et al., filed Jan. 23, 1985, it is disclosed that equally thick selective epitaxial deposits may be made within unequally sized apertures by appropriately varying the HCl flow rate during the deposition.

In SELECTIVE EPITAXY OF SILICON UNDER QUASI-EQUILIBRIUM CONDITIONS, E. Sirtl et al., *Semiconductor Silicon*, R. R. Haberrecht and E. L. Klein, Eds., New York: Electrochemical Society, May 1969, pp. 189-199, it is indicated that the selectivity of a silicon epitaxial deposition process can be made independent of the Si/SiO$_2$ ratio so long as deposition occurs at quasi-equilibrium conditions in the Si/Cl(Br)/H system using SiCl$_4$ as the source gas and a deposition temperature of approximately 1200° C. However, it is indicated that despite the use of quasi-equilibrium deposition conditions, surface defects at the edges of the deposits always remain. Lastly, U.S. Pat. No. 3,661,636, PROCESS FOR FORMING UNIFORM AND SMOOTH SURFACES, J. M. Green, II, et al., May 9, 1972 describes the use of an SiCl$_4$/H$_2$ deposition system at temperatures between approximately 1110° and 1400° C. so as to yield an epitaxial deposit that does not have ridges along the edge thereof, although the relationship between growth rate and the size of the deposit, i.e. the Si/SiO$_2$ ratio is not addressed.

These references notwithstanding, we have recognized the desirability of performing a selective silicon epitaxial deposition which is independent of Si/SiO$_2$ surface area ratio and nucleation site width through a wide range of HCl concentrations, and have discovered a means for achieving such a result.

SUMMARY OF THE INVENTION

A method for depositing monocrystalline silicon at a uniform rate onto a plurality of unequally sized monocrystalline nucleation sites comprises initially providing a substrate having an apertured oxide mask on a major surface thereof. The oxide mask includes a plurality of apertures each of which exposes a nucleation site on the substrate surface. The substrate is then exposed to a mixture of dichlorosilane and hydrogen chloride at 850° C. and a pressure less than approximately 50 torr, for a predetermined time. This yields a moncrystalline silicon island extending from each nucleation site. Each of the islands has a substantially flat profile across the major surface thereof and all islands are equal in thickness.

DETAILED DESCRIPTION OF PREFERRED EMBODIMENT

Figure 1:
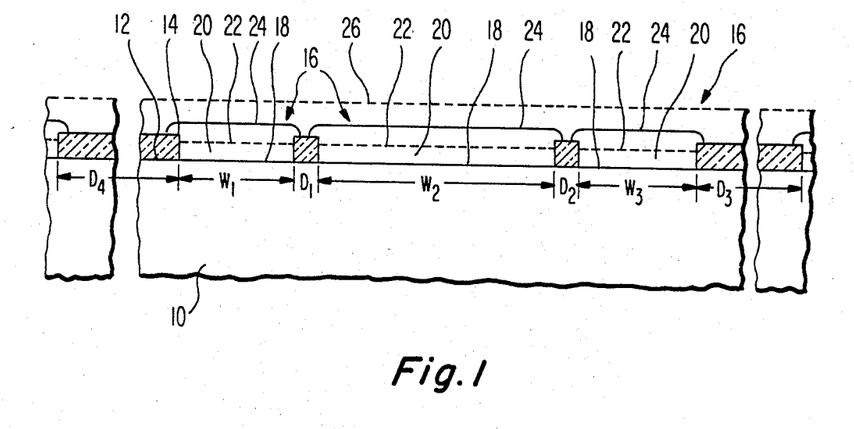
FIG. 1 is a sectional view of an exemplary structure fabricated in accordance with the selective epitaxial deposition process of the present invention.

An exemplary structure fabricated in accordance with the invention is illustrated in FIG. 1. The structure is fabricated on a substrate 10 having a substantially planar major surface 12. In the preferred embodiment the substrate 10 is monocrystalline silicon, although it is expected that certain other monocrystalline materials such as sapphire (single crystalline aluminum oxide) or beryllia (single crystalline beryllium oxide) would be suitable as well. A mask 14, which in the preferred embodiment is silicon dioxide, is disposed on the major surface 12 and includes a plurality of apertures 16 therethrough. Each of the apertures 16 exposes a portion of the substrate surface 12 that is referred to as a nucleation site 18.

In the structure of the present invention there is no restriction as to the dimensions of or spacings between the apertures 16. For example, illustrated in the sectional view of FIG. 1 are three rectangular apertures having widths $W_1$, $W_2$ and $W_3$ with mask spacings $D_1$ and $D_2$ separating $W_1$ from $W_2$ and $W_2$ from $W_3$ respectively. Dimensions $D_3$ and $D_4$ represent the distances to the next nearest apertures. The actual dimensions of $W_1$, $W_2$ $W_3$, $D_1$, $D_2$, $D_3$ and $D_4$ are determined by design and photolithographic constraints. That is, the apertured mask 14 is typically fabricated by first forming a silicon dioxide layer cn the surface 12 and then photolithographically defining and etching appropriately sized and located apertures. There are no particular limitations on the thickness of the mask 14, although a convenient range might be 0.01 to 5 microns. The mask 14 may be formed by standard CVD or thermal growth techniques and the apertures may be conventionally formed using standard photoresist technology and wet chemical or dry etching.

The masked substrate is then subjected to particular epitaxial deposition conditions such that a monocrystalline silicon island 20 is formed within each aperture 16. This selective monocrystalline silicon growth may be terminated before the islands 20 reach the thickness of the mask 14, as represented by the broken line 22; at a point at which islands 20 extend beyond the thickness of mask 14, as illustrated by the surface 24; or at a point at which the islands 20 grow together to form a single surface, as represented by the broken line 26. It is important to note that in all cases, regardless of whether the islands 20 are thinner than the mask 14 or thicker than the mask 14, the major surfaces thereof, as identified at 22, 24 and 26, are substantially flat. Furthermore, each island 20 is of equal thickness regardless of the size or location of the aperture 16 in which it is formed.

The specific epitaxial deposition conditions of the invention include a mixture of dichlorosilane and hydrogen chloride, a temperature of 850°0 C., and a pressure less than approximately 50 torr. Preferably, the hydrogen chloride:dichlorosilane partial pressure ratio should be equal to or less than approximately 2:1 and preferably in the approximate range of 2:1 to 1:1. The deposition time is predetermined by the silicon island thickness desired. As the data presented in subsequent FIGURES demonstrates, the indicated temperature and pressure are critical parameters in the disclosed process. The process may be performed, for example, in a conventional barrel reactor to which dichlorosilane is added at the rate of approximately 0.4 liter per minute (l/min), HCl is added at a rate between 0.4 and 0.9 l/min and hydrogen is added at a rate of 50 l/min with the total system pressure being 30 torr.

Figure 2:
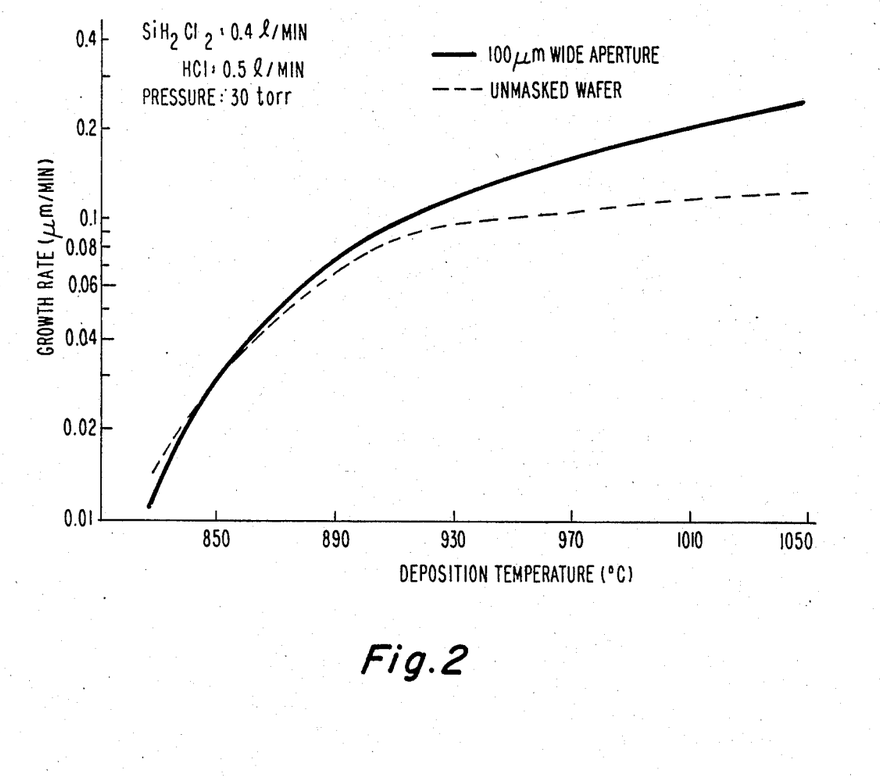
FIG. 2 is a graph of silicon growth rate vs. deposition temperature.

As illustrated by the graph of FIG. 2, the growth rate of monocrystalline silicon at a particular $SiH_2CL_2/HCl$ ratio and deposition pressure is a function of both deposition temperature and the size of the nucleation site. The solid line indicates growth rate within a 100 micron wide nucleation site and the broken line indicates growth rate on an unmasked wafer, representing an essentially infinitely wide aperture. The two lines intersect, i.e. the growth rates are equal in both aperture sizes, when the deposition temperature is 850° C. Hence, the method of the present invention specifies a deposition temperature of 850° C. so as to achieve a uniform growth rate regardless of aperture size.

Figure 3A:
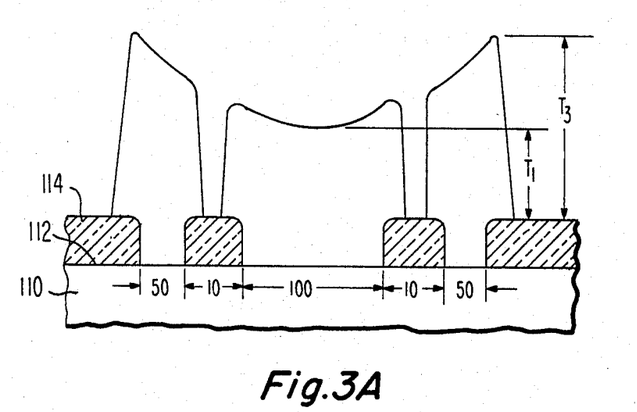
FIGS. 3A and 3B represent thickness profiles of silicon that has been deposited at different temperatures.
Figure 3B:
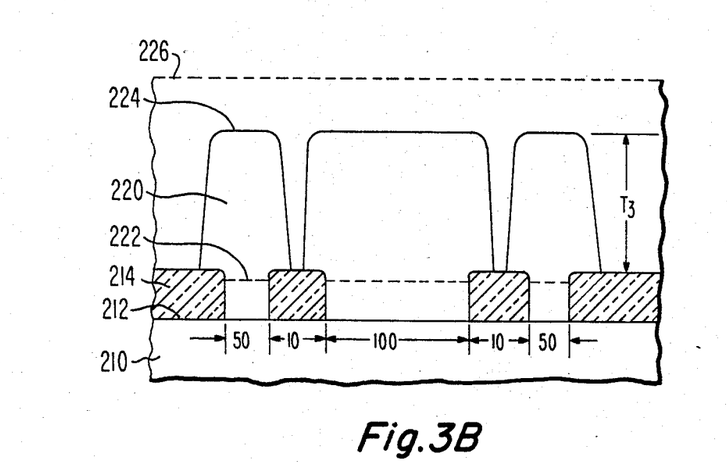

FIGS. 3A and 3B illustrate the profiles of representative epitaxial depositions at different deposition temperatures. In each case the deposition occurs through an apertured oxide mask on the surface of a monocrystalline wafer. In FIGS. 3A and 3B the substrates are identified as 110 and 210 respectively, the substrate major surfaces are identified at 112 and 212 respectively and the apertured masks are identified at 114 and 214 respectively. These features of FIGS. 3A and 3B are of a similar configuration to the substrate 10, surface 12, and mask 14 of FIG. 1. In the examples of FIGS. 3A and 3B the dimensions $W_1$, $W_2$ and $W_3$ are 50, 100 and 50 microns respectively and the dimensions $D_1$ and $D_2$ are 10 microns in all cases. The distances to the next nearest apertures, as represented by $D_3$ and $D_4$ in FIG. 1, are very large compared to $D_1$ and $D_2$. For example, when $D_1$ and $D_2$ are 10 microns, $D_3$ and $D_4$ are greater than 250 microns.

The structure of FIG. 3A is representative of deposition at 1050° C. The epitaxial deposit is characterized by a very significant thickness variation from the center of the central aperture (thickness $T_1$) to the outer edges of the peripheral apertures (thickness $T_2$). For example, the outermost portion of the silicon island within an aperture that borders a relatively large expanse of mask 114 may be thicker by a factor of 2 than the central portion of a silicon island within a centrally located aperture. In the illustrated structure, grown at 1050° C., $T_1 = 1.5$ μm and $T_2 = 2.4$ μm.

In FIG. 3B the deposition temperature is 850° C. and the epitaxial deposit has a profile in accordance with the present invention. The surface 224 of each island 220 is substantially flat. In the illustrated structure the thickness $T_3$ a of each island is 3.0 μm. Similarly, if the deposition process that was used to fabricate the structure of FIG. 3B was terminated at an earlier time, a substantially flat surface 222 would be formed on the surface of the silicon island 220 within each aperture. If the deposition process was continued, the islands 220 would eventually coalesce and create a single planar surface 226.

Figure 4:
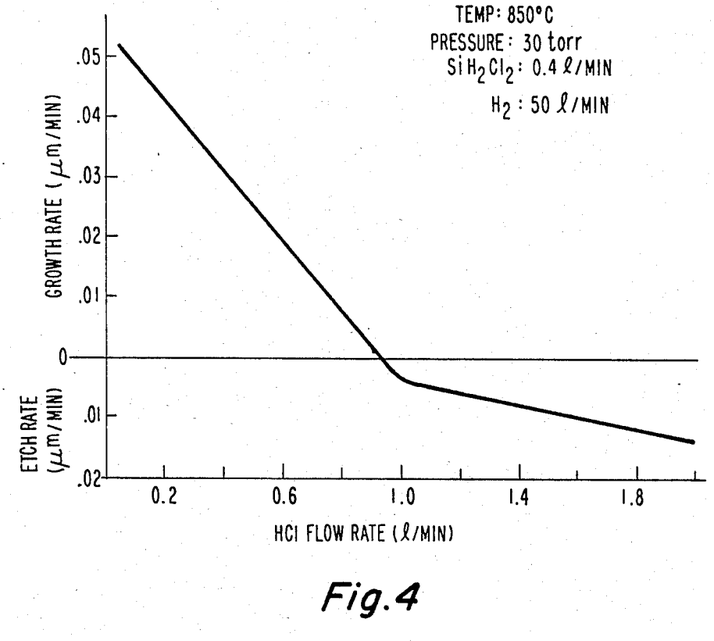
FIG. 4 is a graph of growth rate vs. HCl flow rate.

FIG. 4 is a plot of growth rate/etch rate as a function of HCl flow rate. The parameters of the deposition are 850° C. temperature, 30 torr pressure, 0.4 l/min $SiH_2Cl_2$ flow rate and 50 l/min $H_2$ flow rate. The graph illustrates that the rate of epitaxial silicon deposition may be controlled by manipulating the HCl concentration in the deposition reactor and shows a maximum HCl flow rate of about 0.9 l/min (yielding a $HCl/SiH_2Cl_2$ partial pressure ratio of about 2:1) above which no growth will occur. It is important to note that this graph represents data both at relatively narrow apertures and relatively wide apertures. At the indicated 850° C. temperature and 30 torr pressure substantially identical growth rates are observed regardless of aperture size.

Figure 5:
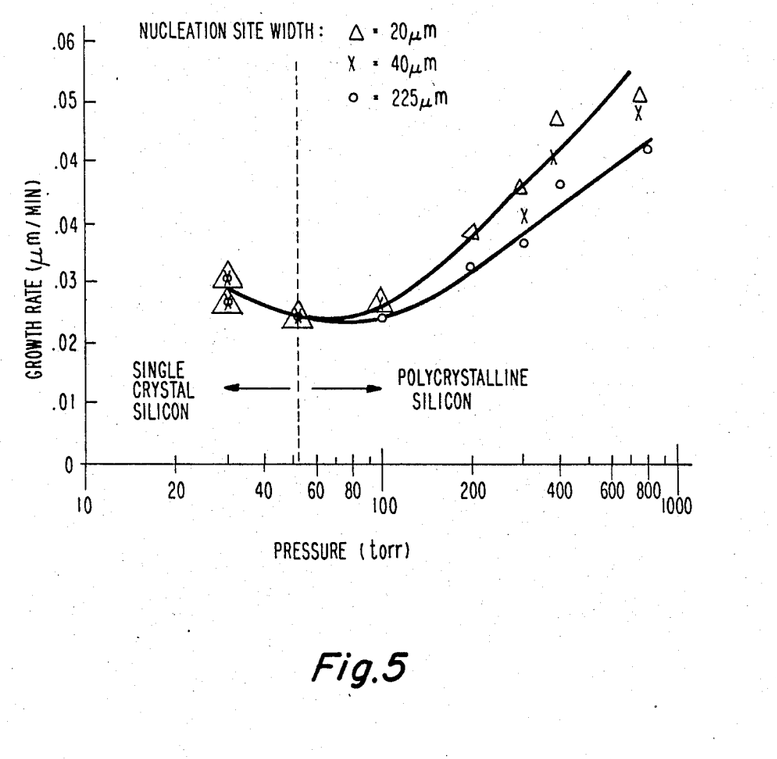
FIG. 5 is a graph of growth rate vs. deposition pressure.

FIG. 5 is a plot of growth rate for different aperture sizes as a function of deposition pressure. The deposition temperature is 850° C. and the flow rates of $SiH_2Cl_2$ and HCl are constant. The graph demonstrates that a critical pressure exists at approximately 50 torr. Above 50 torr the epitaxial deposit is substantially polycrystalline in structure whereas below 50 torr a monocrystalline structure is formed. Furthermore, the growth rates within each differently sized aperture is different at pressures above 50 torr but seem to converge to a single growth rate at approximately 50 torr. The data represents growth rates measured in apertures having widths of 20, 40 and 225 microns, as illustrated.

Figure 6A:
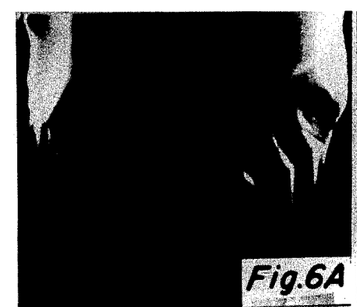
FIGS. 6A and 6B are scanning electron microscope (SEM) photomicrographs of a monocrystalline silicon island fabricated in accordance with the invention.
Figure 6B:
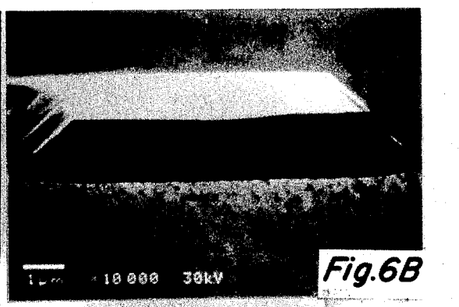
Figure 7A:
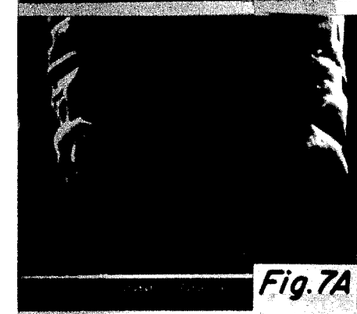
FIGS. 7A and 7B are SEM photomicrographs of a silicon island fabricated at a deposition pressure of 50 torr.
Figure 7B:
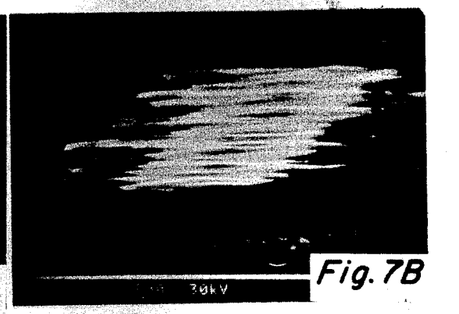
Figure 8A:
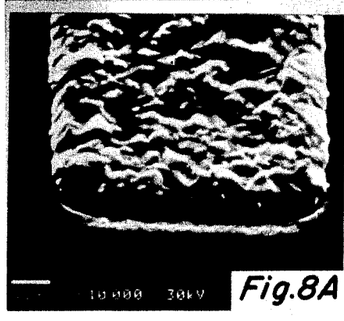
FIGS. 8A and 8B are SEM photomicrographs of silicon island fabricated at a deposition pressure of 100 torr.
Figure 8B:
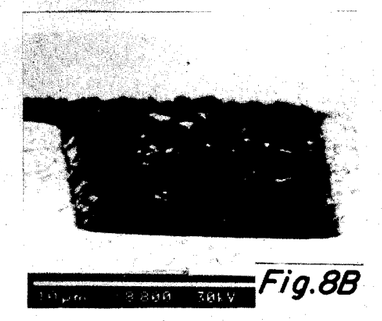

The SEM photomicrographs of FIGS. 6 through 8 further illustrate the morphology of the epitaxial silicon deposit as a function of deposition pressure. Basically, FIGS. 6A, 7A and 8A differ from FIGS. 6B, 7B and 8B by the angle at which the view is taken. The dichlorosilane/HCl flow rate and deposition temperature was the same for the structure in each FIGURE. FIGS. 6A and 6B illustrate a deposit produced at 30 torr by the method of the invention. It is a high crystalline quality single crystal structure. FIGS. 7A and 7B, deposited at 50 torr, also show a single crystal structure, although there is significant faceting present along the edges of the monocrystalline island. The silicon island of FIGS. 8A and 8B was deposited at 100 torr and is clearly polycrystalline in structure and unsuitable in applications which require monocrystalline material.

Thus, the present invention establishes a critical temperature, 850° C., and a critical pressure range, $\leq 50$ torr, at which the epitaxial deposition should be performed. This will yield a high quality monocrystalline deposit which is selective. The advantages that arise from using this critical temperature and pressure are (1) a uniformly thick deposit occurs in each nucleation site regardless of nucleation site size or location; and (2) the HCl concentration may be varied (within limits) without affecting the uniformity of aperture-to-aperture growth rate and the topology of the deposit, so as to permit the addressing of other variables such as the relative rate of vertical to horizontal epitaxial growth and the crystal morphology of the deposit.

What is claimed is:

1. A method for depositing monocrystalline silicon, at a uniform rate, onto a plurality of unequally sized monocrystalline nucleation sites comprising:

providing a substrate having an apertured oxide mask on a major surface thereof, the oxide mask including a plurality of apertures therethrough, each aperture exposing a nucleation site on the substrate surface; and exposing the substrate to a mixture of dichlorosilane and hydrogen chloride at 850° C. and at a pressure less than approximately 50 torr, for a predetermined time, so as to yield a monocrystalline silicon island extending from each nucleation site, all islands being equal in thickness and each having a substantially flat profile across the major surface thereof.

2. A method in accordance with claim 1, wherein the hydrogen chloride:dichlorosilane partial pressure ratio is less than approximately 2:1.

3. A method in accordance with claim 1 further comprising:
including hydrogen in the mixture of dichlorosilane and hydrogen chloride.

4. A method in accordance with claim 3 comprising:
providing dichlorosilane at a flow rate of approximately 0.4 l/min;
providing hydrogen chloride at a flow rate between approximately 0.4 l/min and 0.9 l/min; and
providing hydrogen at a flow rate of approximately 50 l/min.

5. A method in accordance with claim 1 wherein the substrate is monocrystalline silicon.

* * * * *